United States Patent
Bishop et al.

(10) Patent No.: US 6,633,621 B1
(45) Date of Patent: Oct. 14, 2003

(54) APPARATUS AND METHOD FOR SYNCHRONIZING A CLOCK USING A PHASE-LOCKED LOOP CIRCUIT

(75) Inventors: Daniel Eric Bishop, Gilbert, AZ (US); George Jeffrey Geier, Scottsdale, AZ (US); Jeffrey Scott Moffett, Gilbert, AZ (US); George Arthur Schauer, Chandler, AZ (US); Roger Charles Hart, Gilbert, AZ (US); Joel Lloyd Gross, Gilbert, AZ (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/531,689

(22) Filed: Mar. 20, 2000

(51) Int. Cl.[7] .................................................. H03D 3/24
(52) U.S. Cl. ...................................... 375/376; 375/375
(58) Field of Search ........................ 375/371, 373–376, 375/327; 327/147, 150, 156, 159; 331/11, 17; 370/324, 516, 518

(56) References Cited

U.S. PATENT DOCUMENTS

| | | | |
|---|---|---|---|
| 5,757,786 A | * 5/1998 | Joo | 370/324 |
| 5,841,396 A | 11/1998 | Krasner | 342/357 |
| 5,905,388 A | * 5/1999 | Van Der Valk et al. | 327/107 |
| 6,351,164 B1 | * 2/2002 | Yoshie | 327/156 |
| 6,438,188 B1 | * 8/2002 | Streett | 375/376 |

OTHER PUBLICATIONS

An article entitled "Improving the Accuracy and Integrity of GPS Timing" by Grier & King from IEEE Frequency Control Symposium, Jun., 1995.

* cited by examiner

Primary Examiner—Phoung Phu
(74) Attorney, Agent, or Firm—Frank J. Bogacz (57) ABSTRACT

A system for synchronizing a clock includes a phase-locked loop (PLL) circuit that generates or receives (304) timing errors that are based on timing information from multiple timing sources. Gain blocks (214) weight (306) the timing errors, which are then combined (308) into a loop time error. A loop integrator (226) integrates (310) the loop time error to produce an input used to adjust (312) an oscillator frequency. A corresponding oscillator clock signal is fed back (240) to one or more phase detectors (206), which receive (302) timing reference signals and generate timing errors. When a timing errors indicates that a problem exists with a timing source, the impact of the problematic timing source is reduced (430, 504), or oscillator frequency adjustments are suspended (608). When used on a satellite (700), at least one of the timing errors can be based on times of transmit and times of arrival of time messages exchanged between the satellite and its neighbors (716).

22 Claims, 6 Drawing Sheets

APPARATUS AND METHOD FOR SYNCHRONIZING A CLOCK USING A PHASE-LOCKED LOOP CIRCUIT

TECHNICAL FIELD

The invention relates generally to synchronizing a clock to a system time and, more specifically, to synchronizing a clock to a system time using multiple time sources.

BACKGROUND OF THE INVENTION

In some multi-node communications networks, it is important that each node is synchronized with the system time. This is particularly true in wireless networks, where each node is responsible for sending data packets to other nodes or to destination devices. For example, in a wireless network that uses a time division multiple access (TDMA) communications protocol, a node must be synchronized with the system time so that it can transfer data packets during the appropriate time slots. If the node is not synchronized with the system time, the node may miss sending the data packets within the correct time slots, resulting in lost data. The inability to maintain synchronization with the system time can have significant consequences, such as a severe node failure or an inability to establish or maintain communications channels, for example.

Some prior art systems use the Global Positioning System (GPS) as a source of system time. These systems incorporate a GPS receiver within each node that has a clock to be synchronized. The GPS receiver receives signals from the multiple GPS satellites, and the system uses those signals to determine system time and synchronize its clocks. Some of these systems use a carrier frequency signal to calibrate the GPS receiver's local oscillator. Such a system is described, for example, in U.S. Pat. No. 5,841,396, entitled "GPS Receiver Utilizing a Communication Link," issued on Nov. 24, 1998.

One disadvantage to using GPS for time determination is that the GPS receiver must have a direct line of sight with multiple GPS satellites in order to achieve an acceptable level of accuracy. Generally, the more satellites that are in the field of view of the GPS receiver, the more accurate are the time determinations. For example, under current levels of selective availability imposed on civilian GPS signals, the "three sigma" accuracy is roughly 100 nanoseconds divided by the square root of the number of GPS satellites tracked by the receiver.

On the other hand, the fewer the GPS satellites signals received (e.g., due to GPS satellite failures or obstructions along the line of sight between the receiver and the GPS satellites), the less accurate the time determinations will likely be. Therefore, the accuracy of the time determinations is highly susceptible to GPS satellite visibility, making GPS a non-robust system for some applications.

What are needed are apparatus and methods that provide a highly available and accurate, synchronized clock. Further needed are apparatus and methods that can enhance the accuracy of a GPS reference signal in order to provide a more accurate clock than is possible with prior art apparatus and methods.

DETAILED DESCRIPTION

Embodiments of the present invention provide appartus and methods that produce a highly available and accurate clock using a phase-locked loop (PLL) circuit. This is achieved by determining timing errors of multiple timing reference signals and combining those timing errors to produce a more accurate input to an oscillator, where the oscillator output is fed back through the PLL circuit. In one embodiment, each of the timing errors is weighted, depending on how much the system would like each timing error to influence the oscillator input.

In one embodiment, the apparatus and methods of the present invention enhance the accuracy of a GPS reference signal in order to provide a more accurate clock than is possible with prior art apparatus and methods. This is done by using multiple GPS reference signals, in one embodiment, which have errors that can be combined in the PLL circuit with timing errors from other sources. In another embodiment, only a single GPS reference signal is used, and it is combined with one or more timing errors from one or more other sources.

Further, in one embodiment, the apparatus and methods of the present invention reduce the impact of an inaccurate reference signal on a clock generated within a PLL circuit. When an error or outage of one of the reference signals occurs, the system reduces the impact of that reference signal by eliminating the signal as an input to the PLL circuit, or by reducing the weight given to the associated timing error. If an outage to all of the references occurs, the system eliminates each as an input to the PLL circuit, and the oscillator "coasts" at a previous value until one or more of the references are restored.

In one embodiment, the apparatus and methods of the present invention are implemented on a satellite, using satellite-specific reference signals to provide a clock that is sufficiently accurate for the satellite system. Each satellite's concept of time in the network is based on the satellite's GPS receiver and the time transfer from other satellites in the network, according to one embodiment. Time-of-arrival (TOA) and time-of-transmit (TOT) measurements are generated from time messages transferred between satellites on inter-satellite links, referred to herein as "cross-links." As will be explained in more detail below, these messages are used to transfer a satellite's concept of network time to another satellite. The transferred time and GPS receiver time are each compared to the PLL generated time, thus generating timing errors. Those errors are then input into the PLL circuit.

In order to smooth out variations in GPS accuracy, some systems use a GPS receiver to discipline a stable oscillator within a PLL circuit. Such a system is described, for example, in Grier and King, "Improving the Accuracy and Integrity of GPS Timing," IEEE Frequency Control Symposium, June 1995. The stable oscillator frequency is used to generate one or more clock signals that enable the node to synchronize with the system time.

Essentially, the PLL circuit averages the GPS error with time. Large, momentary GPS errors are filtered through the PLL averaging process, so that those errors will have little immediate impact on the accuracy of the output of the PLL circuit's stable oscillator. In this manner, the PLL circuit smoothes out rapid excursions in GPS error.

If the GPS error remains, then over time, the PLL circuit would eventually track the GPS error. The PLL loop bandwidth determines the general speed of the loop response to an input signal. A wider bandwidth is faster than a narrow bandwidth, and consequently a narrow bandwidth will better track out rapidly changing error in the reference, while a wider bandwidth will better track out rapid errors in the oscillator. Arbitrarily narrowing the bandwidth to minimize contribution in error from the reference, however, does not result in better overall performance. This is because the oscillator also adds noise to the system. Consequently, care must be used to select the optimum bandwidth to minimize the total error due to both the reference (e.g., the GPS signal) and the oscillator. The PLL filter order can also be varied, where higher order filters can be used to compensate for oscillator aging effects.

Within the PLL circuit, if a node detects a larger-than-normal GPS error (e.g., due to a GPS satellite failure or an insufficient number of visible satellites), the node can reject the corresponding GPS signal inputs, and then "coast" the stable oscillator until the error condition is alleviated.

Figures 1, 2:
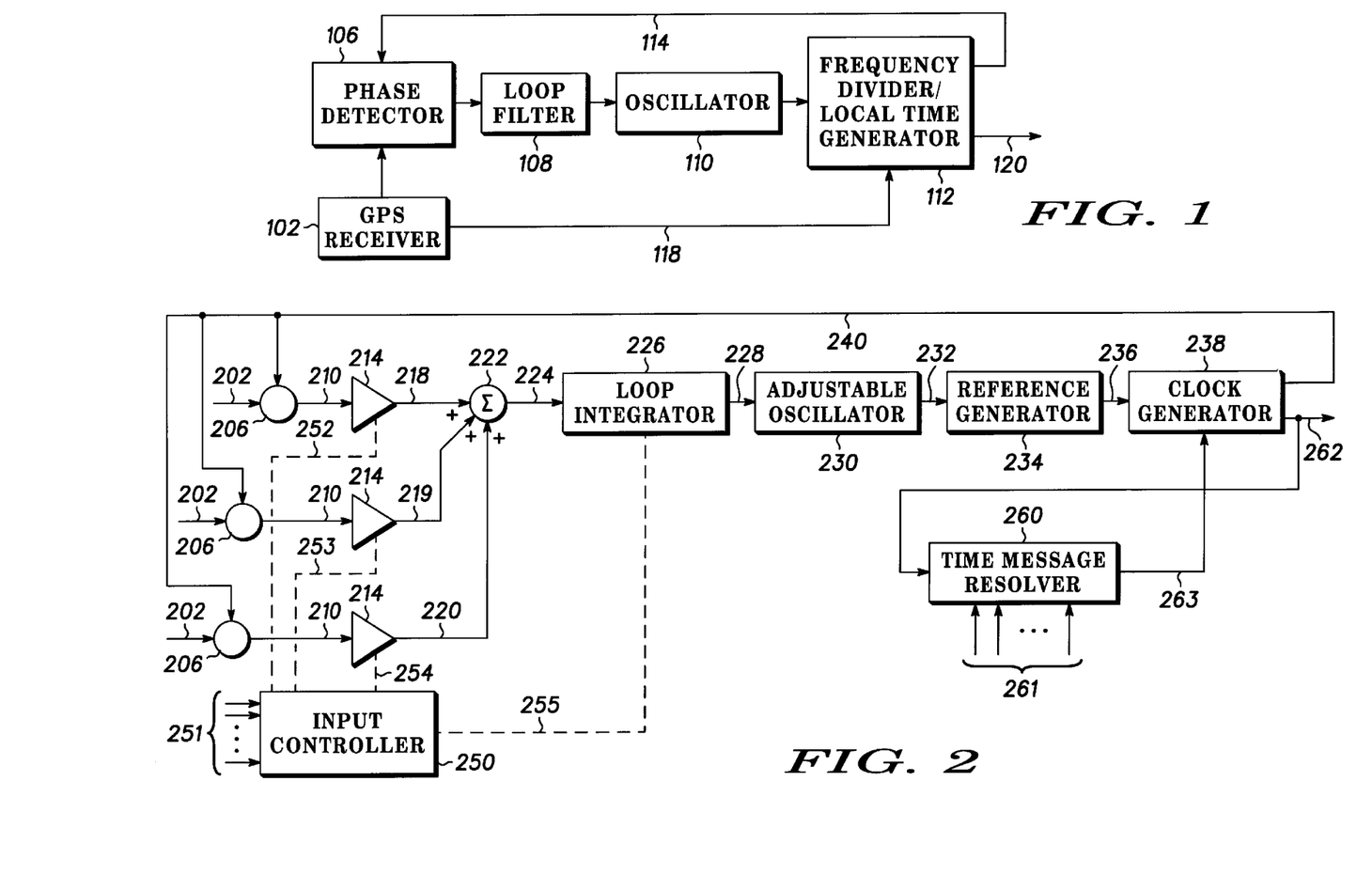
FIG. 1 illustrates a simplified block diagram of a GPS receiver used to discipline a stable oscillator within a phase-locked loop (PLL) circuit.
FIG. 2 illustrates a simplified block diagram of a PLL circuit that uses reference signals from multiple time sources to discipline an adjustable oscillator in accordance with one embodiment of the present invention.

FIG. 1 illustrates a simplified block diagram of a GPS receiver 102 used to discipline a stable oscillator 110 within a PLL circuit. The PLL circuit includes a phase detector 106, loop filter 108, stable oscillator 110, and frequency divider/local time generator 112.

Phase detector 106 accepts the GPS reference signal 104 as a reference clock, and an oscillator-generated clock signal 114 as a skewed clock. From these clocks 104, 114, phase detector 106 generates a phase difference. Oscillator 110 could be, for example, a voltage controlled oscillator. In such case, loop filter 108 is used to integrate the phase difference between the GPS reference signal 104 and the clock signal 114 into a voltage level. This voltage is then fed into the oscillator 110, which adjusts its oscillator frequency according to the voltage level.

Oscillator 110 provides a local reference 116. Frequency divider/local time generator 112 generates the oscillator-generated clock signal 114 and a time signal 120 based on the local reference 116. In this manner, the phase difference between the GPS clock and the clock signal 114 is reduced until they are phase-locked to each other.

The purpose of the PLL circuit is to control the stable oscillator 110 in a manner that drives the error between the GPS reference signal 104 and the clock signal 114 toward zero, thus synchronizing the oscillator phase and frequency with the GPS clock. In other words, the PLL circuit phase locks the local reference 116 to the GPS reference signal 104.

Accordingly, phase detector 106 continuously measures the phase error between the GPS reference signal 104 and the clock signal 114. The GPS reference signal 104 can be, for example, a one pulse per second (1PPS) signal. Under normal, steady state operations, the clock signal 114 also would be roughly a 1PPS signal with some random deviations. Clock signal 114 is generated by taking the output frequency from the oscillator 110, and dividing that frequency, utilizing frequency divider/local time generator 112, down to a frequency that corresponds to the GPS clock frequency. Because the GPS reference signal 104 (e.g., the 1PPS signal) is repetitive, GPS receiver 102 also provides time message 118 to frequency divider/local time generator 112, so that the absolute time of the GPS reference signal 104 can be unambiguously identified.

FIG. 1 illustrates that the ability of the oscillator 110 to provide a synchronized clock signal depends upon: 1) the quality of the reference signal 104 provided by the GPS receiver 102; 2) the quality of oscillator 110; and 3) the PLL loop characteristics. If any of these items has poor performance, then the resulting time signal 120 will also be poor. The PLL loop characteristics and oscillator quality are within the control of the system designers, and they can be made as robust as necessary through redundancy and careful design.

Reliance of the reference on a source such as a GPS receiver, however, undermines the robustness of the PLL circuit illustrated in FIG. 1. Even redundant GPS receivers spatially located within close proximity do not provide the necessary reliability, since each of the multiple receivers would be susceptible to the same line of sight issues with the GPS satellites. Thus, if the GPS reference signal 104 is inaccurate due to GPS satellite failures or an inadequate number of visible GPS satellites, then over time the oscillator frequency will track the average error.

Accordingly, the system illustrated in FIG. 1 may not be appropriate for applications that require a highly available and accurate, synchronized clock. Communications satellite systems, especially time division multiple access (TDMA) systems, require highly available and accurate synchronized clocks, since it is critical for the satellites to be synchronized with system time in order to effectively communicate with other devices, such as other satellites and ground units. Therefore, a system such as that illustrated in FIG. 1 would be insufficient for many satellites and other applications.

In one embodiment, the system robustness is increased by providing multiple reference signals, and using those signals to discipline the PLL oscillator. FIG. 2 illustrates a simplified block diagram of a PLL circuit that uses one or more reference signals 202 from one or more time sources to discipline an adjustable oscillator 230 within the circuit, in accordance with one embodiment of the present invention. Although three reference signals 202 are shown in FIG. 2, more or fewer reference signals could be used in various embodiments. FIG. 2 is described, below, in conjunction with FIG. 3, which illustrates a flowchart of a method for synchronizing a clock in accordance with one embodiment of the present invention.

The PLL circuit includes one or more phase detectors 206, multiple gain blocks 214, combiner 222, loop integrator 226, adjustable oscillator 230, and feedback loop 240. In one embodiment, the PLL circuit also includes reference generator 234 and clock generator 238. In still other embodiments, the system includes input controller 250, which provides control inputs to the PLL circuit, and/or time message resolver 260, which receives a digital clock signal and determines the correct time to associate with clock generator 238.

Each of the phase detectors 206 receives (block 302, FIG. 3) a timing reference signal from a timing source, compares the timing reference to an oscillator time 240, and generates (block 304, FIG. 3) a timing error 210 based on the comparison. The oscillator time 240 is a clock generated from the frequency output of oscillator 230. Thus, the oscillator time 240 is considered a skewed clock that is being synchronized to the various system timing sources.

One or more of the timing sources, for example, could be a GPS receiver, and the timing reference signal could be a 1PPS clock signal (as defined above). In one embodiment, a single GPS receiver is used in conjunction with other timing sources (e.g., inter-satellite time message transfers and/or other sources). In another embodiment, redundant GPS receivers are used. These redundant GPS receivers, which may or may not be used in conjunction with other timing sources, help to ensure accurate time synchronization even in the presence of the failure of one or more receivers or other timing sources.

Where a GPS receiver is used to provide a timing reference signal 202, the GPS receiver uses a reference oscillator to acquire and track the GPS satellite signals. In one embodiment, the oscillator 230 within the PLL circuit is the same oscillator that is used by the GPS receiver to acquire and track the signals. In another embodiment, the GPS receiver may use a different oscillator.

In addition to the timing errors 210 generated by phase detectors 206, other timing errors (not shown) can be received by the PLL circuit. Essentially, each timing error is based on timing information from one of multiple timing sources. In various embodiments, phase detectors 206 can be contained locally within the timing circuitry (e.g., GPS time reference input) or they can be remote, where a timing error message is sent to the timing circuitry (e.g., TOA/TOT messages for cross-link time transfer).

As explained previously, in one embodiment, the system is used in a satellite network in which satellites communicate with each other over cross-links. In such a system, one or more of the timing sources could be a neighbor satellite (i.e., a satellite that communicates with the satellite housing the PLL circuit over a cross-link).

In this embodiment, each satellite's concept of time in the network is based on the satellite's GPS receiver and the time transfer from other satellites in the network. Each satellite transmits a time message to its neighbor satellites over the cross-links. In one embodiment, the transfer occurs on the satellite's oscillator time tick, and the sending satellite keeps track of the TOT of the message. The receiving satellite measures the TOA of the time message, and it sends the TOA back to the sending satellite. From the TOT and TOA, the sending satellite then determines the difference between its local oscillator's time tick and the neighbor satellite's time tick, resulting in a satellite-to-satellite timing error. In one embodiment, these satellite timing errors are corrected for errors due to the range rate between neighboring satellites.

Because the satellites are widely separated in distance, each satellite's GPS receiver will have a different field of view, and each will encompass a varied set of GPS satellites. Thus, the time solution determined by each satellite's GPS receiver may be slightly different, due to each satellite's receiver viewing a potentially different set of GPS satellites.

By transferring time from node to node within the satellite network, the time of each satellite more closely tracks the other satellites' times, and ultimately each satellite's concept of network time is based not on a single GPS receiver, but the aggregate of all the GPS receivers within the network.

Additionally, if a regional outage. of the GPS service occurs (e.g., due to jamming over a battlefield area), the GPS receiver on a satellite over that region would be jammed. That satellite would continue to maintain time, using one embodiment of the present invention, by relying on time transfer from other satellites in the network.

In one embodiment, the satellites also transmit time source health messages over the cross-links. These messages indicate the estimated error of the time source. Each satellite uses the messages received from its neighbor satellites to determine the relative weighting each input is given over the other inputs.

In the above embodiment, a GPS receiver is used as an external time source to the satellite network. In other embodiments, other external time sources could be used, such as links to ground based time sources or to other systems that provide the same functionality as GPS, for example. Also in the above embodiment, each satellite has access to an independent time source (e.g., GPS). Once the satellites have operating cross-links, however, an independent time source for each satellite may not be required, according to one embodiment. Instead, the satellites may use only the messages transferred between neighboring satellites to generate timing errors. In such an embodiment, satellite resources may be conserved. This can be done, for example, by reducing redundancy requirements and by powering off some or all of the GPS receivers in the network.

In one embodiment, one or more timing sources could also be ground devices that communicate with the satellite over ground communication links. In such an embodiment, the satellites and ground devices could transfer time messages and calculate deltas and timing errors in the manner described above.

Thus, timing errors can be generated by a phase detector (e.g., phase detector 206, FIG. 2), or they can be received from an external source from the PLL circuit, as described in the above satellite embodiment. Referring back to FIG. 2, the timing errors 210 are received by gain blocks 214, in one embodiment. Although three gain blocks 214 are shown in FIG. 2, more or fewer gain blocks could be used in other embodiments. Generally, the number of gain blocks included in the circuit equals the number of timing sources or timing errors that are used as inputs to the circuit, although this is not essential.

In one embodiment, each gain block 214 applies a weighting factor (block 306, FIG. 3) to the timing error it receives. In one embodiment, the weighting factors are under software control, and they can be set to emphasize one input over another. Thus, the ability to control the weighting factors gives the PLL circuit the ability to enhance the contributions from more accurate or dependable timing sources, while decreasing the contributions from less accurate or defective timing sources.

The loop bandwidth can also be adjusted by increasing or decreasing the weighting factors. In one embodiment, the sum of the weighting factors may be more or less than one. Increasing the sum of the weighting factors causes the loop bandwidth to increase, which tends to track out frequency shifts of the oscillator due to environment. Decreasing the sum of the weighting factors narrows the loop bandwidth, which tends to average out the timing errors and filter out more of the jitter on the timing error inputs.

In another embodiment, the weighting factors may always sum to a value of one. In such an embodiment, the loop bandwidth would not change due to varying the weighting factors. In still another embodiment, the weighting factors can be set up always to sum to a value of one, and an additional weighting factor in the PLL feedback path can be changed from the value of one in order to vary the loop bandwidth.

In one embodiment, to rapidly reduce a relatively large phase error, the system sets the weighting factors to zero, which suspends external loop inputs. The system then changes the dividers in clock generator 238, causing changes in the timing clock frequencies. Done properly, this results in a rapid, coarse adjustment of the phase error. In this manner, large frequency shifts are performed in clock generator 238, rather than in oscillator 230 or reference generator 234.

This coarse adjustment ability is desirable, because high quality oscillators often have a very narrow tuning range. If only oscillator 230 were used to adjust out a large phase error, the adjustment may take an unacceptably long amount of time. For example, an oscillator with a ±1PPM tuning range would take approximately 500,000 seconds (i.e., nearly six days) to track out a 0.5 second phase error. By using clock generator 238 to add or subtract high frequency clock pulses, such a phase error could be reduced within just a few seconds.

The rate of the phase error reduction depends on how well the system can withstand changes in the timing signals and the specific timing signals generated. Using the above method of phase error reduction, all of the timing signals would maintain their correct timing relationships with respect to each other, with the exception that the timing patterns would be stretched or compressed due to the change in frequency imposed by clock generator 238. Once the phase error has been sufficiently reduced, the clock generator's dividers are set to normal division, and the loop begins controlling oscillator 230 based on the time error inputs. In the manner described above, the system has a wide initial bandwidth to phase lock the oscillator to the time error inputs.

As will be explained in more detail below, when the system reaches a steady state (i.e., the loop time error approaches zero), the system can reject inputs that are out of tolerance (e.g., inputs that cause excessive timing errors). The system can then coast on its previous or concurrent good inputs.

In one embodiment, the gain blocks 214 are implemented using a Kalman filter, which learns which timing sources are the most accurate and adapts the gain block weights accordingly. In addition, the Kalman filter may attempt to explicitly (e.g., by adding states which are directly estimated) or implicitly (e.g., through its process noise model) compensate for the effects of PLL oscillator aging. Further, the filter's estimates may be used directly to compensate the PLL circuit when a higher order loop filter is used. In addition, for a satellite-based embodiment, the Kalman filter may use a high fidelity orbit model for the satellite to filter the errors in the GPS measurements and to isolate GPS satellite failures.

In another embodiment, an input controller 250 provides control inputs 252, 253, 254 to gain blocks 214. These control inputs can adjust the weights applied by each gain block, and they also can cause a particular input to be completely eliminated from or added to the loop, when appropriate.

In one embodiment, time source health messages 251 are input to controller 250. These messages 251 indicate the health of the input time sources. If a health message 251 indicates that the health of a particular source is bad, then the time source is not used (e.g., the gain of that input is reduced or set to zero). In still another embodiment, gain blocks 214 are not included in the PLL circuit and, thus, no weighting factors are applied to the timing errors.

The weighting factors provide considerable flexibility in the application of the method of the present invention. For example, these factors can adjust the loop bandwidth to optimize tracking performance, and they can be used to emphasize one input over the other.

The gain block outputs 218, 219, 220, in the form of weighted timing errors, are combined (block 308, FIG. 3) by combiner 222. In one embodiment, combiner 222 outputs the sum of the weighted timing errors. In another embodiment, combiner 222 outputs the average of the weighted timing errors. Either way, the output of combiner 222 is a loop time error 224, which is input into the loop integrator 226.

Loop integrator 226 integrates (block 310, FIG. 3) the loop time error. In one embodiment, this essentially involves adding the loop time error, multiplied by some constant, to the previous integrated loop time error value. This results in a ramp function output that increases rapidly when the loop is initialized, but levels off to a relatively constant value with relatively minor perturbations when the loop approaches steady state (i.e., when the loop time error approaches zero).

In one embodiment, input controller 250 also provides pole/zero compensation control 255 to loop integrator 226. This type of control is desirable for applications that allow widely varying loop bandwidths, because it ensures the stability of the control loop. In one embodiment, the loop is a second order PLL, with adjustment of pole/zero compensation to maintain loop stability with loop bandwidth changes. In another embodiment, pole/zero compensation may be provided by a control element separate from input controller 250.

The output of loop integrator 226 is a frequency control input 228 that controls the frequency of adjustable oscillator 230. In one embodiment, the control input 228 is a digital message. In another embodiment, where the adjustable oscillator 230 is a voltage-controlled oscillator, the control input 228 is a voltage level.

Adjustable oscillator 230 adjusts (block 312, FIG. 3) its output oscillator frequency 232 based on the frequency control input 228. In one embodiment, adjustable oscillator 230 is a master oscillator, which outputs an oscillator frequency 232 that is used by various components in the system. Basically, oscillator frequency 232 is an analog sinusoidal wave.

Although some components may operate using the oscillator frequency 232, other components may need a frequency that is lower or higher than oscillator frequency 232. Accordingly, in one embodiment, oscillator frequency 232 is input into reference generator 234, which generates (block 314, FIG. 3) one or more reference frequency signals by using common frequency generation techniques, such as frequency multiplication, division, mixing or PLL circuitry.

Reference generator 234 then supplies these reference signals, which are in the form of analog sinusoidal waves, to the system components (e.g., transceivers, processors, modulators, and demodulators) that need them. Since all reference frequencies are based on the same oscillator frequency, the reference frequency signals are phase coherent.

One reference frequency 236 is provided as an input to clock generator 238, in one embodiment. Clock generator 238 is used to generate (block 316, FIG. 3) one or more digital clock signals 262 that are used by various system components. Clock generator 238 also generates the system time with which each node is to be synchronized. In addition, clock generator 238 generates the oscillator time 240, which is used as the PLL feedback to phase detectors 206. In another embodiment, clock generator 238 could receive the reference frequency directly from oscillator 230, rather than from reference generator 234.

In one embodiment, time message resolver 260 receives one of the digital clock signals 262, and it determines the correct time to associate with clock generator 238. This determination is based on time messages inputs 261 and time errors 218220. Time message resolver 260 sends a correct time message 263 to clock generator 238. In another embodiment, clock generator 238 and time message resolver 260 could be incorporated together as a single loop component.

Since the reference generator 234 and the clock generator 238 generate reference frequencies and clocks that are dependent on the oscillator frequency, the reference and clock signals shift upward and downward as the oscillator frequency shifts upward and downward. This also shifts the oscillator time 240, causing the oscillator time eventually to catch up to the reference signals. In this manner, the PLL circuit attempts to drive the loop time error to zero.

Figure 3:
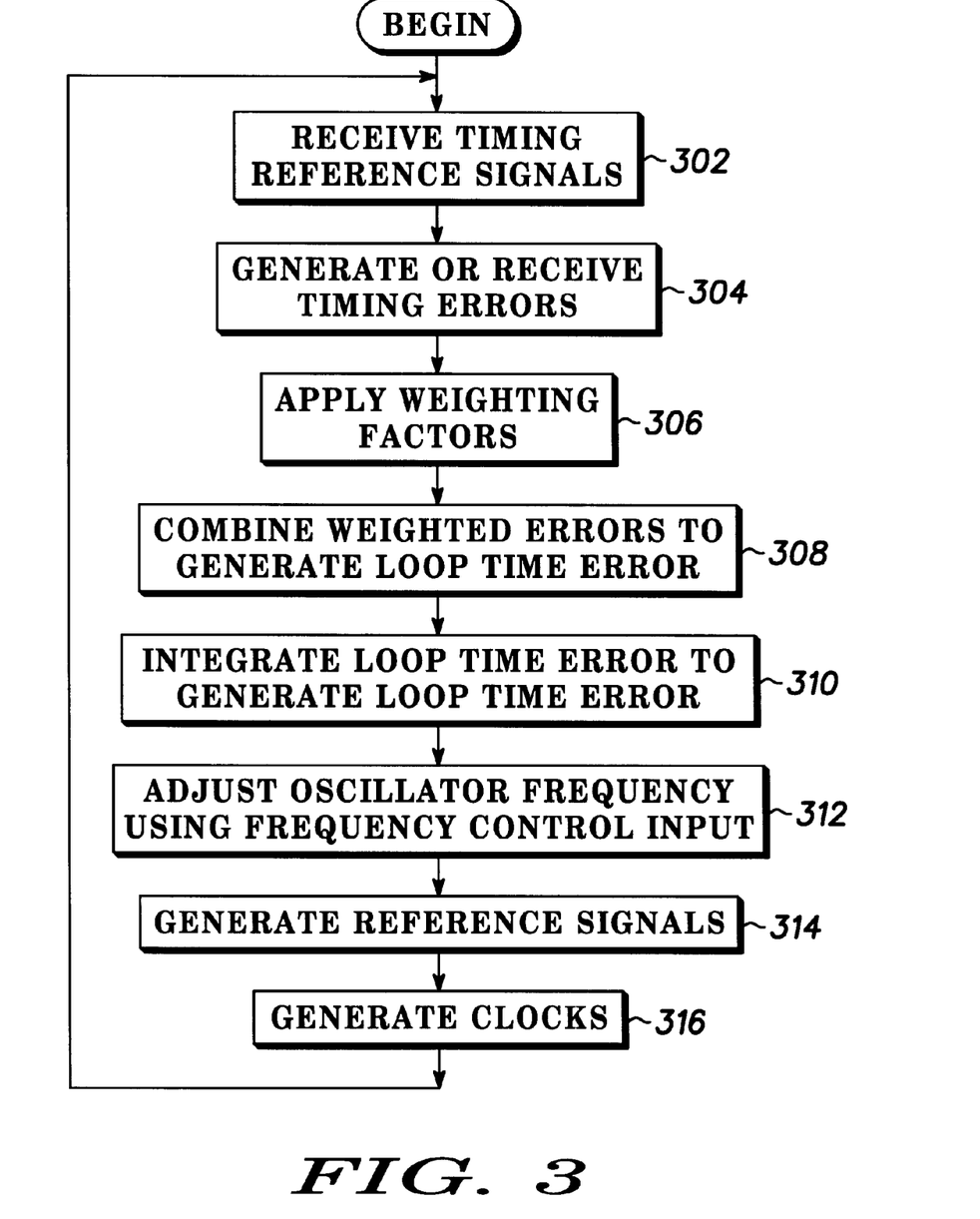
FIG. 3 illustrates a flowchart of a method for synchronizing a clock in accordance with one embodiment of the present invention.

The description of FIGS. 2 and 3, above, traces the processing of one instance of a set of timing reference signals through the PLL circuit. In one embodiment, however, the oscillator frequency 232 is continuously synchronized with the timing sources. Thus, as timing reference signals and timing errors continue to be received, each of the blocks illustrated in FIG. 3 are performed in parallel.

In one embodiment, phase detector 206, gain blocks 214, combiner 222, loop integrator 226, and their associated interconnections are part of a single application specific integrated circuit (ASIC). In alternate embodiments, these components could be discrete and/or could be included in multiple, interconnected circuits.

As indicated previously, input controller 250 provides control inputs 252–254 to gain blocks 214. These control inputs adjust the weighting factors applied by each gain block, and they also can cause a particular input to be completely eliminated from the loop, when appropriate.

In one embodiment, only one input (e.g., input 202) at a time is used to control the adjustable oscillator 230. Other inputs are used as references, and they are evaluated by input controller 250 to determine if a failure of the currently used timing source has occurred. This can be determined by comparing the currently used timing source input to one or more of the reference inputs, and declaring a fault when the currently used timing source input diverges substantially from the reference inputs.

When that occurs, the input controller reduces the impact of the faulty input by causing the PLL circuit to autonomously switch over to one or more of the other reference inputs. Input controller 250 can cause this switch to occur, for example, by adjusting the weighting factors applied by the gain blocks 214 corresponding to the currently used input and the reference inputs. In another embodiment, the timing errors associated with each timing source are compared to determine if the currently-used timing source has failed or is out of tolerance.

Figure 4:
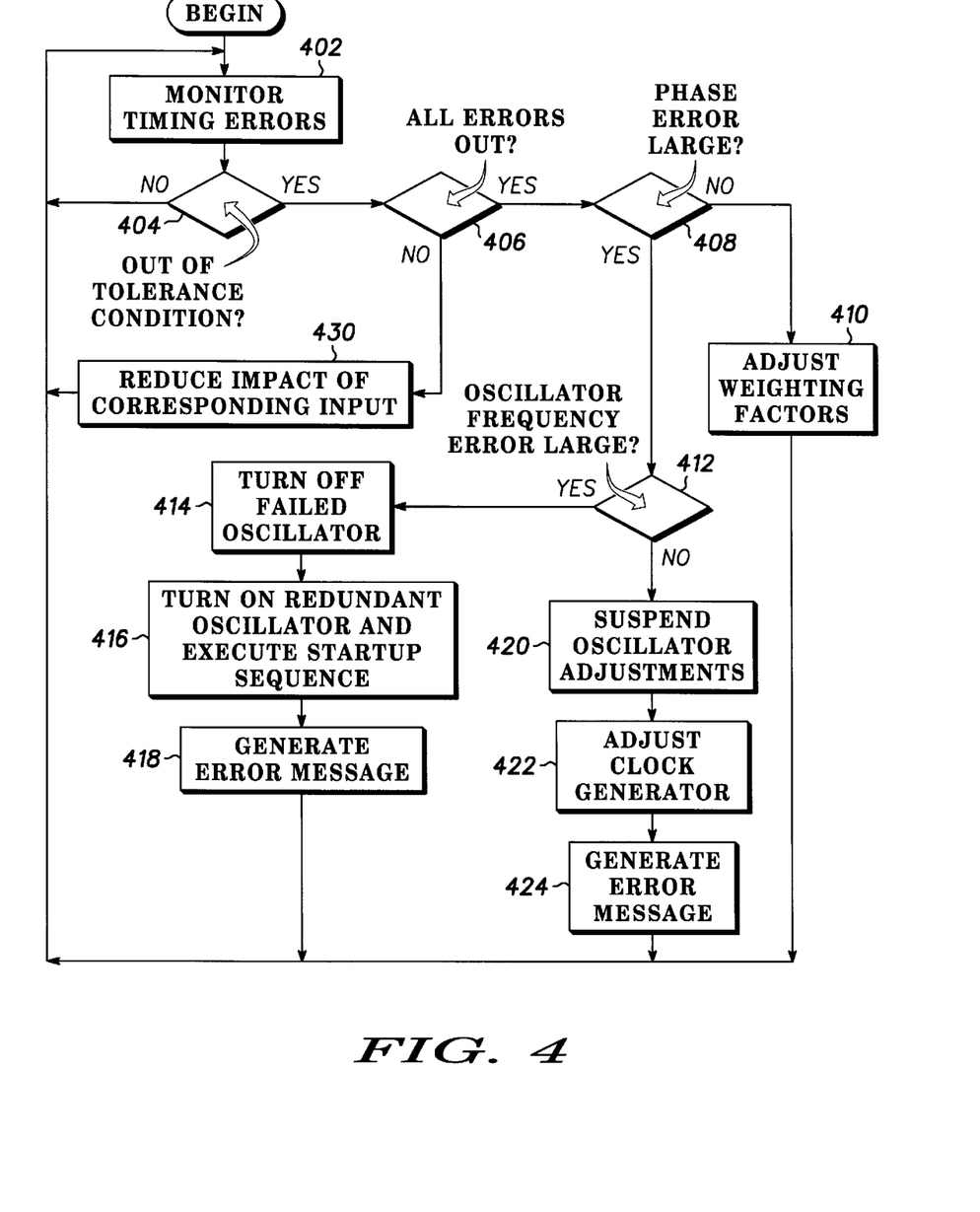
FIG. 4 illustrates a flowchart of a method for reducing the impact of an out of tolerance timing error in accordance with one embodiment of the present invention.
Figure 5:
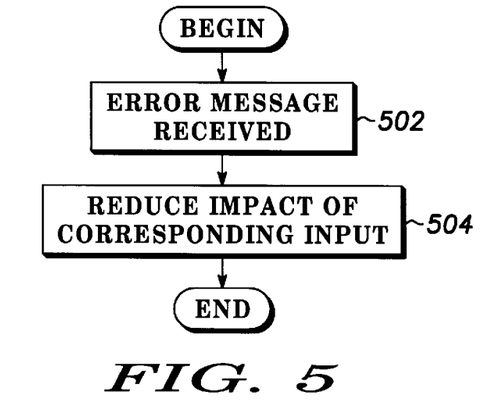
FIG. 5 illustrates a flowchart of a method for reducing the impact of a faulty timing signal source in accordance with one embodiment of the present invention.
Figure 6:
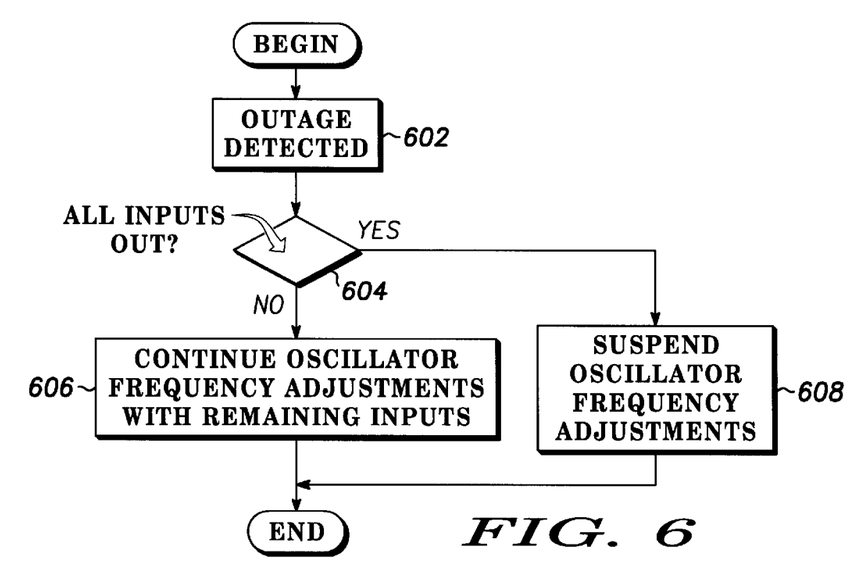
FIG. 6 illustrates a flowchart of a method for coasting the oscillator in accordance with one embodiment of the present invention.

In one embodiment, input controller 250 adjusts the weighting factors due to events such as a variation in timing source accuracy, timing source failure, or oscillator failure. In other embodiments, separate components can be responsible for adjusting the weighting factors based on various types of events. FIGS. 4–6 illustrate flowcharts of methods for responding to various events that warrant weighting factor adjustments. In one embodiment, each of the methods is performed by input controller 250 (FIG. 2), although the methods could be performed by other system components (not shown) in other embodiments.

FIG. 4 illustrates a flowchart of a method for reducing the impact of an out of tolerance timing error in accordance with one embodiment of the present invention. The method begins, in block 402, by monitoring the timing errors (e.g., errors 210, FIG. 2) generated by the phase detectors (e.g., phase detector 206, FIG. 2) or received from other sources.

A determination is made, in block 404, whether any of the timing errors is out of tolerance. In one embodiment, each type of timing error can have a pre-defined out of tolerance limit. For example, if a timing error exceeds a certain value or indicates that its corresponding input deviates from the norm by a certain percentage, then that timing error may be considered out of tolerance. If no timing error is considered out of tolerance, then the procedure iterates as shown in FIG. 4.

If a timing error is out of tolerance, then a determination is made, in block 406, whether all timing errors are out of tolerance. If so, this indicates that something may be wrong with the oscillator (e.g., oscillator 230, FIG. 2). Oscillator errors could occur for a variety of reasons, such as a hard failure of the oscillator, initial system turn on, or a one-time event that changes the phase of the system.

When all timing errors are out of tolerance, a determination is made, in block 408, whether the phase errors are large or small. If the phase errors are not large, then the weighing factors are adjusted, in block 410, in order to provide optimum performance. The procedure then iterates as shown.

If the phase errors are large, then a determination is made, in block 412, whether the oscillator frequency phase errors are larger than normal for the conditions that the oscillator is under. If the frequency errors are larger than normal, a hardware failure is assumed. In one embodiment, the failed oscillator is turned off, in block 414, and a redundant oscillator is turned on and a startup sequence is executed, in block 416. In one embodiment, an error message is also generated, in block 418, and the procedure iterates as shown.

If block 412 determines that the frequency errors are not large, which is a condition that is possible even with a good oscillator, then the adjustments to the oscillator are suspended, in block 420. In addition, the clock generator is adjusted, in block 422, by adding or subtracting high frequency pulses to reduce the phase error to a smaller value. In one embodiment, an error message is also generated, in block 424, indicating the initial and final phase error and that the loop is not tracking. The procedure then iterates as shown.

Referring back to block 406, if all errors are out, then in another embodiment, all inputs are eliminated, and the oscillator is allowed to coast on previously good inputs until one or more errors are back within tolerance. Coasting the oscillator is described in more detail in conjunction with FIG. 6.

If all timing errors are not out of tolerance, then the impact of the input corresponding to the out of tolerance timing error is reduced, in block 430. In one embodiment, this is done by reducing or eliminating the out of tolerance input to the PLL circuit. This can be achieved by applying a very small or zero weighting factor to the corresponding timing error. In other embodiments, the impact can be reduced by ignoring the corresponding input, which can be done at the phase detector (e.g., phase detector 206, FIG. 2), the gain block (e.g., gain block 214, FIG. 2), the combiner (e.g., combiner 222, FIG. 2) or elsewhere. Once the input is back within tolerance, the system can reinstate the input, or it can apply a higher weighting factor to the input.

In one embodiment, the system also can receive and respond to health and/or error messages from the timing sources. FIG. 5 illustrates a flowchart of a method for reducing the impact of a faulty timing signal source in accordance with one embodiment of the present invention. The method begins, in block 502, when the system receives a health or error message from a timing source, where the message indicates that the timing error corresponding to the timing source is inaccurate. The timing error may be inaccurate, for example, when the associated timing source is not functioning properly. For example, if the timing source is a GPS receiver, the receiver may send an error message when it has lost the signal from some or all GPS satellites. Alternatively, the timing error may be inaccurate if a particular cross-link has been lost, or will soon be lost. Such an error message could be generated by the receiving satellite's cross-link transceiver, by the satellite that will be experiencing the failure, or by a ground device that has received an indication that the cross-link has been or will be lost.

Once the error message has been received, the system reduces the impact of the corresponding input, in block 504. As described previously, this could be accomplished by reducing the weighting factor corresponding to that input or by eliminating the input from the circuit. After reducing the impact of the faulty input, the method ends.

The corresponding input can be reinstated or given a higher weighting factor after it has been restored. Restoration of the input can be indicated by a subsequent message or by the satellite detecting that the error condition no longer exists.

Occasionally, all inputs may experience an outage condition, meaning that each input can either be completely unavailable or it may be out of tolerance. In one embodiment, if all inputs are out, the oscillator is coasted until one or more of the inputs has been restored to an in tolerance condition. In order to coast the oscillator, the system suspends the oscillator's frequency adjustments.

FIG. 6 illustrates a flowchart of a method for coasting the oscillator in accordance with one embodiment of the present invention. The method begins, in block 602, when an outage of a timing source is detected. The outage could be detected by the input controller (e.g., controller 250, FIG. 2) or it could be detected by receiving a message from the timing source or some other device.

When an outage is detected, a determination is made, in block 604, whether all timing inputs are out. If not, the system then reduces the impact of the corresponding input, as described in conjunction with FIGS. 4 and 5, but it continues oscillator frequency adjustments with the remaining inputs, in block 606. The method then ends.

If the system determines that all inputs are out, then the oscillator frequency adjustments are suspended, in block 608. Suspension of the frequency adjustments can be done by applying a zero input into the loop integrator 226 (FIG. 2), or by otherwise applying a fixed control input into the adjustable oscillator 230 (FIG. 2). The loop integrator can be provided with a zero input, for example, by applying zero weighting factors in each of the gain blocks 214 (FIG. 2), or by otherwise forcing a zero output from combiner 222 (FIG. 2). The method then ends.

After at least one of the outage conditions has been relieved, the method of the present invention reinstates the corresponding input into the control loop. The relief of the outage could be detected by the input controller (e.g., monitor 250, FIG. 2) or it could be detected by receiving a message from the timing source or some other device. The input is then reinstated, for example, by applying a non-zero weighting factor to the corresponding timing error or by otherwise causing the loop time error to include the weighted timing error. This causes the oscillator frequency adjustments to be resumed, if they have been suspended.

As described previously, the PLL circuit of the present invention can be incorporated into a satellite system, where the PLL circuit is used to synchronize the adjustable oscillator to the system time or the satellite network time.

Figure 7:
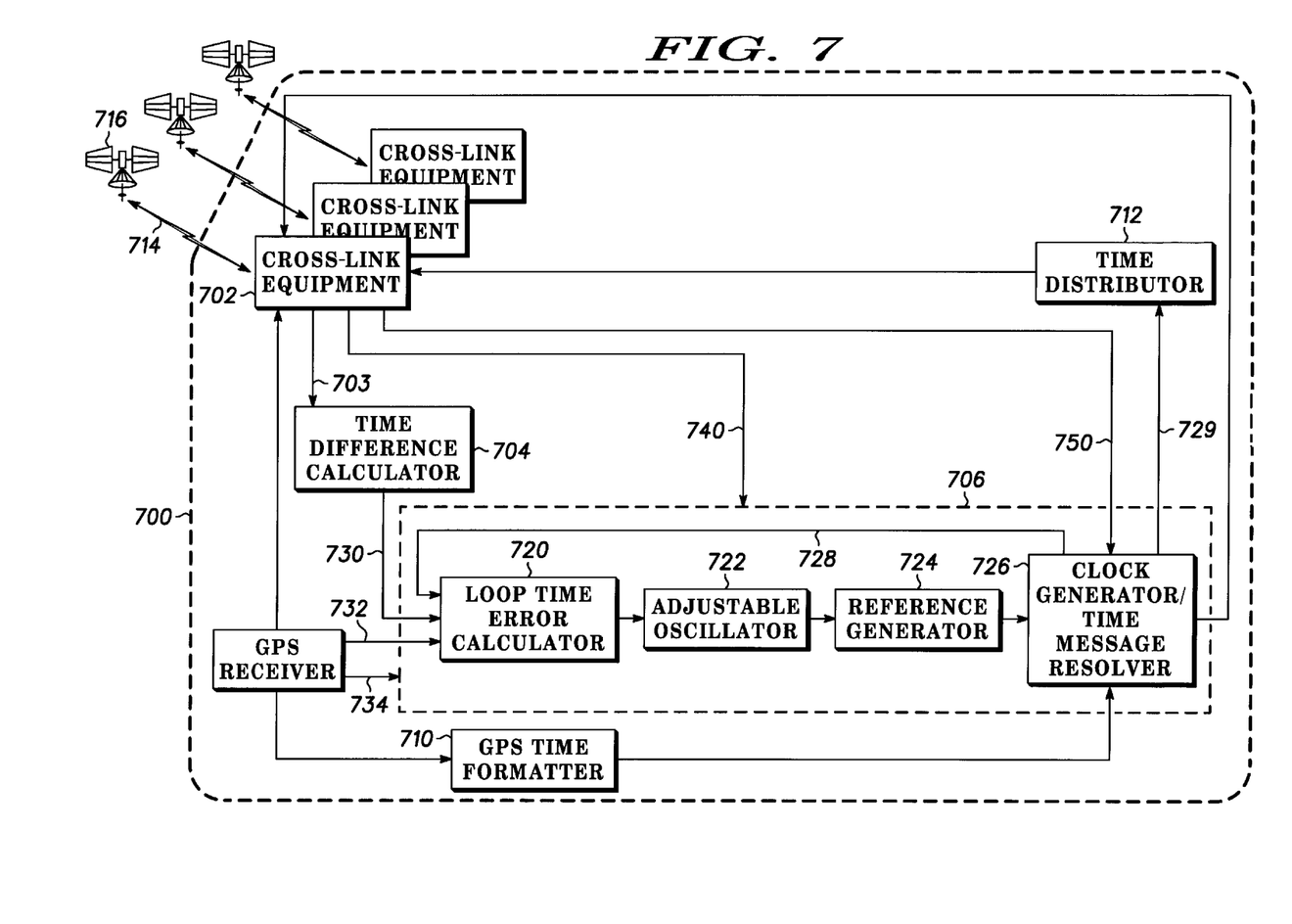
FIG. 7 illustrates a simplified block diagram of a satellite-based system for synchronizing a clock in accordance with one embodiment of the present invention.
Figure 8:
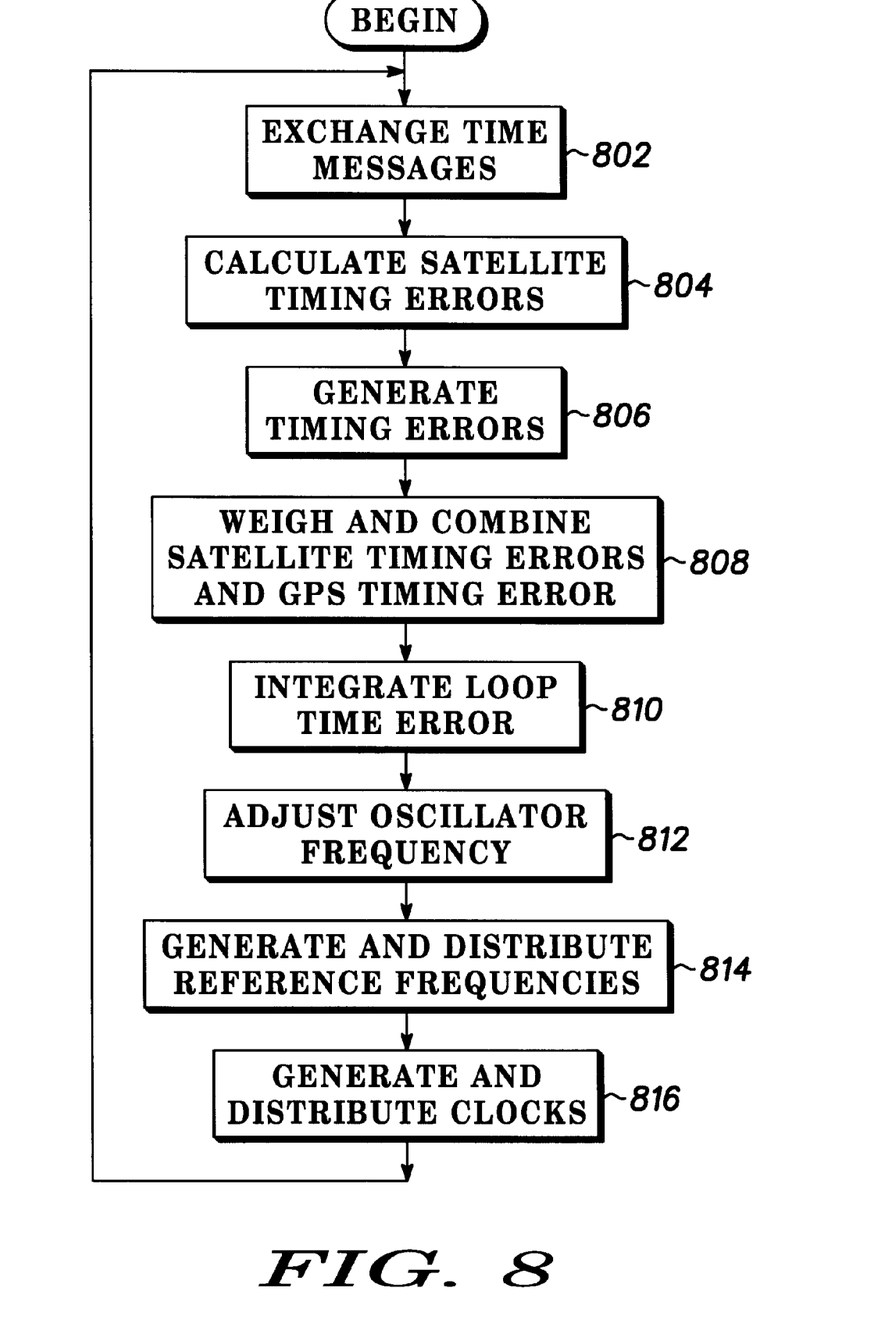
FIG. 8 illustrates a flowchart of a method for synchronizing a clock in a satellite-based system in accordance with one embodiment of the present invention.

FIG. 7 illustrates a simplified block diagram of a satellite-based system 700 for synchronizing a clock in accordance with one embodiment of the present invention. FIG. 7 should be viewed in conjunction with FIG. 8, which illustrates a flowchart of a method for synchronizing a clock in a satellite-based system in accordance with one embodiment of the present invention.

In one embodiment, the synchronization system 700 resides on a satellite of a satellite network, although the system could be used on another type of node in a communications system. System 700 includes cross-link equipment 702, a time difference calculator 704, one or more GPS receivers 706, PLL circuit 708, a GPS time formatter 710, and a time distributor 712.

Cross-link equipment 702 enables the satellite to establish and maintain cross-links 714 with one or more neighbor satellites 716. In one embodiment, cross-links 714 could be optical inter-satellite links, radio frequency links, or some other type of communications link. In another embodiment, similar equipment could be used to establish links with ground devices.

As explained previously, the satellite exchanges (block 802, FIG. 8) time messages with the neighbor satellites 716 via the cross-links 714 and the cross-link equipment 702, while keeping track of the TOT of each message. The neighbor satellites then send back time messages that indicate the TOA of the transmitted messages at the neighbor satellites. From the TOT and TOA 703, the time difference calculator 704 calculates (block 804, FIG. 8) the timing error on each cross-link. In one embodiment, signals are sent to and received from one or more ground devices, and the time difference calculator 704 calculates the timing error on each ground link.

These timing errors are then input 730, along with any inputs 732 from the one or more GPS receivers 706 into PLL circuit 708. PLL circuit 708 includes a loop time error calculator 720, adjustable oscillator 722, reference generator 724, clock generator/time message resolver 726, and feedback loop 728. Loop time error calculator 720 performs the functions separately performed by the phase detector 206, gain blocks 214, combiner 222, and loop integrator 226 shown in FIG. 2. Loop time error calculator 720 may be a single ASIC, in one embodiment, or may be composed of multiple ASICs or other hardware devices or software. Loop time error calculator 720 accepts the cross-link and/or ground link timing errors and the GPS receiver inputs. From the inputs, it generates timing errors (block 806, FIG. 8). Loop time error calculator 720 then weights and combines the timing errors (block 808, FIG. 8), and it integrates the resulting loop time error (block 810, FIG. 8), resulting in a frequency control input.

Adjustable oscillator 722 then adjusts the oscillator frequency (block 812, FIG. 8) based on the frequency control input. The resulting oscillator frequency is then used by reference generator 724 to generate and distribute (block 814, FIG. 8) the reference frequencies used on board the satellite. One reference frequency is input to the clock generator/time message resolver 726, which generates (block 816, FIG. 8) the oscillator time, which is fed back via feedback loop 728. Clock generator/time message resolver 726 also generates and distributes various digital clock signals (not shown) to various other satellite components, such as cross-link equipment 702, among other things. In addition, clock generator/time message resolver 726 determines the correct time to associate with clock generator from one of the digital clock signals. This determination is based on time messages inputs 750 and time errors (not shown). In another embodiment, the clock generator and the time message resolver could be separate components.

Clock generator 726 also generates the system time 729, which time distributor 712 sends to the neighbor satellites 716, when appropriate, via the cross-link equipment 702 and cross-links 714. The system time (e.g., which represents the TOA of a received signal) sent from system 700 is used by the neighbor satellites to synchronize their own oscillators, just as the system time sent from those neighbors is used by system 700 to synchronize its oscillator.

At times, an upset in the GPS system or receiver 706 may occur. In such conditions, GPS time formatter 710 can be used to put the GPS input in a format that the clock generator/time message resolver 726 needs to correctly determine system time.

In one embodiment, as described previously, the neighbor satellites and GPS receiver also can provide time source health messages 734, 740 to PLL circuit 708. These messages 734, 740 indicate the health of the various input time sources. The time source health messages 734, 740 are input to an input controller (not shown). If a health message 734, 740 indicates that the health of a particular source is bad, then the corresponding time source is not used (e.g., the gain of that input is reduced or set to zero).

In one embodiment, one satellite in the constellation is considered a master satellite. The identity of the master satellite can be fixed, or it can be transferred from satellite to satellite as needed to maintain a constant link with a particular ground station, for example, or in the event of the failure of the master satellite. The master satellite is responsible for generating the master time (e.g., using one or more GPS receivers or other timing sources), which is transferred throughout the constellation through the cross-links.

In one embodiment, a satellite receives the master time from each of its neighbor satellites, and a weighted timing error is generated for each of the neighboring satellites. In one embodiment, these weighting factors are related to the path lengths back to the master satellite, where the shorter paths are given correspondingly higher weighting factors. Since the master time is transferred to each satellite across multiple links, the loss of a particular cross-link would not significantly affect the receiving satellite's calculation of the loop time error. If all cross-links were lost, the satellite could either coast through the outage by suspending oscillator frequency adjustments, or the satellite could rely on one or more non-satellite inputs (e.g., one or more GPS receiver inputs). Because cross-link time transfer can be very accurate, time synchronization of the constellation also can be very accurate using this embodiment. In another embodiment, no one satellite is the master satellite. Instead, the weighting of the time error inputs is based on the estimate of error to true time for each of the time inputs.

In the foregoing detailed description, reference is made to the accompanying drawings, which form a part hereof, and in which are shown by way of illustration specific embodiments in which the invention may be practiced. These embodiments are described in sufficient detail to enable those skilled in the art to practice the invention. The foregoing detailed description uses terms that are provided in order to make the detailed description more easily understandable. It is to be understood that these terms and the phraseology employed in the description should not be construed to limit the scope of the invention.

It will be appreciated by those of ordinary skill in the art that any arrangement, which is calculated to achieve the same purpose, may be substituted for the specific embodiment shown. For example, although the description refers to implementing the present invention in a satellite communications system, the present invention also could be implemented in a terrestrial network or some other system.

This application is intended to cover any adaptations or variations of the present invention that fall within its scope. The foregoing detailed description, therefore, is not to be taken in a limiting sense, and it will be readily understood by those skilled in the art that various changes in the details, materials, and arrangements of the parts and steps which have been described and illustrated in order to explain the nature of this invention may be made without departing from the spirit and scope of the invention as expressed in the adjoining claims.

What is claimed is:

1. A method for synchronizing a clock using a phase-locked loop circuit which includes an adjustable oscillator and a feedback loop, the method comprising:

receiving multiple timing errors, wherein each timing error is based on timing information from one of multiple timing sources;

combining the multiple timing errors, resulting in a loop time error;

generating an input to the adjustable oscillator based on the loop time error, wherein the adjustable oscillator adjusts an oscillator frequency based on the input, and the oscillator frequency is fed back through the feedback loop, causing the loop time error to approach zero;

monitoring the multiple timing errors;

applying a weighting factor to each of the multiple timing errors, prior to combining the multiple timing errors;

when a particular timing error of the multiple timing errors is out of tolerance, reducing an impact of the particular timing error;

determining whether all of the multiple timing errors are out of tolerance; and when all of the multiple timing errors are out of tolerance, suspending oscillator frequency adjustments.

2. The method as claimed in claim 1, wherein the phase-locked loop circuit is located on a satellite, and receiving the multiple timing errors comprises receiving a satellite timing error that is related to a time of transmit of a time message from the satellite to another satellite over a cross-link.

3. The method as claimed in claim 2, wherein the satellite timing error is also related to a time of arrival, which is determined by the another satellite and received by the satellite over the cross-link.

4. The method as claimed in claim 1, further comprising;

receiving a timing reference signal from a timing source of the multiple timing sources; and comparing the timing reference signal to an oscillator clock that is derived from the oscillator frequency, resulting in a timing error of the multiple timing errors.

5. The method as claimed in claim 4, wherein receiving the timing reference signal comprises receiving the timing reference signal from a Global Positioning System receiver.

6. The method as claimed in claim 1, further comprising applying a weighting factor to each of the multiple timing errors, prior to combining the multiple timing errors.

7. The method as claimed in claim 1, further comprising applying a Kalman filter to the multiple timing errors, prior to combining the multiple timing errors.

8. The method as claimed in claim 1, wherein generating the input to the adjustable oscillator comprises integrating the loop time error.

9. The method as claimed in claim 1, wherein combining the multiple timing errors comprises determining an average of the multiple timing errors, and using the average as the loop time error.

10. The method as claimed in claim 1, further comprising generating one or more reference signals from the oscillator frequency.

11. The method as claimed in claim 1, further comprising generating one or more clocks from the oscillator frequency.

12. The method as claimed in claim 11, wherein one of the one or more clocks is an oscillator clock, and the oscillator clock is fed back through the feedback loop and affects the loop time error.

13. The method as claimed in claim 1, further comprising:

determining whether all of the timing errors are out of tolerance; and when all of the timing errors are out of tolerance, increasing a loop bandwidth by increasing the weighting factors.

14. The method as claimed in claim 1, wherein reducing the impact of the particular timing error comprises reducing the weighting factor applied to the particular timing error.

15. The method as claimed in claim 1, further comprising:

receiving an error message that indicates that a particular timing error is inaccurate; and reducing an impact of the particular timing error.

16. The method as claimed in claim 15, further comprising:

applying a weighting factor to each of the multiple timing errors, prior to combining the multiple timing errors; and wherein reducing the impact of the particular timing error comprises reducing the weighting factor applied to the particular timing error.

17. The method as claimed in claim 1, further comprising:

detecting an outage of one of the multiple timing sources;

determining whether all of the multiple timing sources are out; and when all of the multiple timing sources are out, suspending oscillator frequency adjustments.

18. An apparatus for synchronizing a clock using a phase-locked loop circuit, the apparatus comprising:

at least one phase detector for receiving a timing reference signal from a timing source, and for comparing the timing reference signal to a feedback that is derived from an oscillator frequency, wherein the oscillator frequency is generated by an adjustable oscillator of the phase-locked loop circuit, and wherein comparing the timing reference signal results in a timing error;

a combiner for receiving and combining the timing error and at least one additional timing error, resulting in a combined timing error;

a loop integrator, coupled to the combiner, for generating an input to the adjustable oscillator based on the combined timing error;

the adjustable oscillator, coupled to the loop integrator, for receiving the input and adjusting the oscillator frequency based on the input;

a feedback loop for providing the feedback to the at least one phase detectors; and wherein the apparatus is located on a satellite, and at least one timing error is derived from a time of transmit and a time of arrival of a time message transmitted by the satellite.

19. The apparatus as claimed in claim 18, further comprising:

multiple gain blocks, coupled to the combiner, for applying weighting factors to the timing error and the at least one additional timing error before they are combined by the combiner.

20. The apparatus as claimed in claim 19, further comprising:

an input controller, coupled to the multiple gain blocks, for adjusting the weighting factors based on the timing error.

21. The apparatus as claimed in claim 18, further comprising;

a clock generator for generating at least one clock based on the oscillator frequency.

22. The apparatus as claimed in claim 18, wherein the timing reference signal is a signal from a Global Positioning System receiver.

* * * * *